United States Patent
Cho et al.

(10) Patent No.: US 9,472,614 B2
(45) Date of Patent: Oct. 18, 2016

(54) SUPER JUNCTION SEMICONDUCTOR DEVICE

(71) Applicant: MagnaChip Semiconductor, Ltd., Cheongju-si (KR)

(72) Inventors: Moon Soo Cho, Seoul (KR); Chang Yong Choi, Seoul (KR); Soon Tak Kwon, Seongnam-si (KR); Kwang Yeon Jun, Bucheon-si (KR); Dae Byung Kim, Cheongju-si (KR); Hyuk Woo, Incheon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 177 days.

(21) Appl. No.: 14/226,500

(22) Filed: Mar. 26, 2014

(65) Prior Publication Data

US 2015/0076599 A1    Mar. 19, 2015

(30) Foreign Application Priority Data

Sep. 17, 2013 (KR) .................. 10-2013-0111894

(51) Int. Cl.
*H01L 29/06* (2006.01)
*H01L 29/78* (2006.01)
*H01L 29/40* (2006.01)

(52) U.S. Cl.
CPC ......... *H01L 29/0634* (2013.01); *H01L 29/404* (2013.01); *H01L 29/7802* (2013.01); *H01L 29/7811* (2013.01); *H01L 29/7816* (2013.01); *H01L 29/0638* (2013.01)

(58) Field of Classification Search
CPC .................................. H01L 29/7811
See application file for complete search history.

(56) References Cited

U.S. PATENT DOCUMENTS

| | | | |
|---|---|---|---|
| 5,438,215 A | 8/1995 | Tihanyi | |
| 6,184,555 B1 | 2/2001 | Tihanyi et al. | |
| 6,696,728 B2 | 2/2004 | Onishi et al. | |
| 6,960,798 B2 | 11/2005 | Deboy et al. | |
| 2004/0007736 A1* | 1/2004 | Deboy | H01L 29/0634 257/328 |
| 2009/0079002 A1* | 3/2009 | Lee | H01L 29/66712 257/355 |
| 2013/0181328 A1* | 7/2013 | Cao | H01L 29/0657 257/618 |

* cited by examiner

Primary Examiner — Raj R Gupta (57) ABSTRACT

There is provided a super junction semiconductor device. The super junction semiconductor device includes a cell area and a junction termination area disposed on a substrate, and a transition area disposed between the cell area and the junction termination area, and the cell area, the junction termination area, and the transition area each include one or more unit cells comprising a N-type pillar region and a P-type pillar region among a plurality of N-type pillar regions and a P-type pillar regions that are alternated between the cell area and the junction termination area.

24 Claims, 7 Drawing Sheets

| Area | Split 1 Unit Cell Size (L) | Split 2 Unit Cell Size (L) |
|---|---|---|
| Active Cell area | L | L |
| Transition area1 | L | << L |
| Transition area2 | < L | N/A |
| Junction termination area | L | < L |

FIG.7

SUPER JUNCTION SEMICONDUCTOR DEVICE

CROSS-REFERENCE TO RELATED APPLICATIONS

This application claims the benefit under 35 USC 119(a) of Korean Patent Application No. 10-2013-0111894, filed on Sep. 17, 2013, in the Korean Intellectual Property Office, the entire disclosure of which is incorporated herein by reference for all purposes.

BACKGROUND

1. Field

The following description relates to a super junction semiconductor device and to, for example, a super junction semiconductor device in which different types of plurality of areas are selectively formed in one body.

2. Description of Related Art

High-voltage and high-power devices are often used in power integrated circuit (IC) apparatuses of power conversion and power control systems. A planar gate metal oxide semiconductor field effect transistor (MOSFET) is widely used as such a high-voltage device.

A conventional semiconductor device includes a cell area that controls current and on state drain-to-source resistance Rds(on) and a junction termination area that maintains a breakdown voltage against a reverse voltage generated when the device is turned off.

Unfortunately, such a conventional super junction semiconductor device has a problem that it is difficult to obtain a stable breakdown voltage.

Patent Literature: U.S. Pat. No. 6,696,728

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a super junction semiconductor device includes a cell area and a junction termination area disposed on a substrate, and a transition area disposed between the cell area and the junction termination area, in which the cell area, the junction termination area, and the transition area each include one or more unit cells comprising a N-type pillar region and a P-type pillar region among a plurality of N-type pillar regions and a P-type pillar regions that are alternated between the cell area and the junction termination area, and an average width of a unit cell in the transition area is smaller than an average width of a unit cell in the cell area or the junction termination area.

Upper ends of the P-type pillar regions in the transition area and the cell area may have substantially the same potential.

The junction termination area may be in a floating state.

An average width of the unit cell of the junction termination area in a horizontal direction is equal to or smaller than an average width of the unit cell of at least the cell area.

Ratios between widths of the N-type pillar regions and widths of the P-type pillar regions within the unit cell may be substantially the same.

The transition area and the junction termination area may further include a P-type pillar extension region.

A field oxide film and a plurality of poly plates may be disposed on the P-type pillar extension region.

The general aspect of the super junction semiconductor device may further include a source metal electrode that is connected to the transition area.

The general aspect of the super junction semiconductor device may further include a source metal electrode that is connected to the transition area, and the source metal electrode may extend toward the junction terminal area as to overlap with the field oxide film.

A ploy plate that overlaps with the source metal electrode may be included in the plurality of poly plates.

A width of the N-type pillar region at an upper end of the junction termination area may be smaller than a width at a lower end thereof.

The transition area may include a first area and a second area.

An average width of a unit cell area of the first area in a horizontal region may be greater than an average width of a unit cell area of the second area.

The general aspect of the super junction semiconductor device may further include a P-type body region in the cell area, and a source region within the P-type body region.

The source region may not be included in the transition area.

Only the P-type pillar extension region may be formed at an end of the junction termination area without forming the P-type pillar region.

The P-type pillar regions and the poly plates may be formed in one-to-one correspondence with each other in the junction termination area.

In another general aspect, a super junction semiconductor device may include an epitaxial layer of first conductivity type comprising a cell area, a junction termination area surrounding the cell area, and a transition area disposed between the cell area and the junction termination area, a plurality of second conductivity type pillar regions alternatively disposed between first conductivity type pillar regions of the epitaxial layer such that the cell area, the junction terminal area and the transition area each include two or more pairs of a second conductivity type pillar region and a first conductivity type pillar region, wherein a horizontal width of a first conductivity type pillar region and a second conductivity type pillar region in the cell area is greater than that of the transition area.

The general aspect of the super junction semiconductor device may further include a body region of second conductivity type disposed on each of second conductivity type pillar regions within the cell area, a pillar extension region disposed on each of second conductivity type pillar regions within the transition area and the junction termination area, and a plurality of poly plates each disposed above the pillar extension region in the junction terminal area.

An outermost pillar extension region in the junction terminal area may be paired with a poly plate having a greater horizontal width than widths of other poly plates in the junction terminal area.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

Various examples are described hereafter. An aspect of the present disclosure provides an example of a super junction semiconductor device capable of obtaining a stable breakdown voltage by adding a transition area between a cell area and a junction termination area.

According to an example, in a super junction semiconductor device, a transition area is added between a cell area and a junction termination area, so that the magnitude of a breakdown voltage generated by a critical electric field in a unit cell of the junction termination area is greater than the magnitude of a breakdown voltage generated by a critical electric field in a unit cell of the cell area. Thus, a breakdown voltage to be obtained in an ideal device may be obtained in the cell area. By doing this, the critical electric fields in the unit cells are allowed to be different from each other, so that it is possible to obtain a stable breakdown voltage by decreasing electric fields of other cells other than the cell area and increasing a margin of the cells with respect to a critical electric field.

The present disclosure embraces various modifications and various embodiments. Among them, certain examples are described in detail with reference to the accompanying drawings. In the description of the present disclosure, when it is determined that detailed descriptions of known functions or configurations related to the present disclosure would obscure the gist of the present disclosure, the descriptions thereof are not presented.

Figure 1:
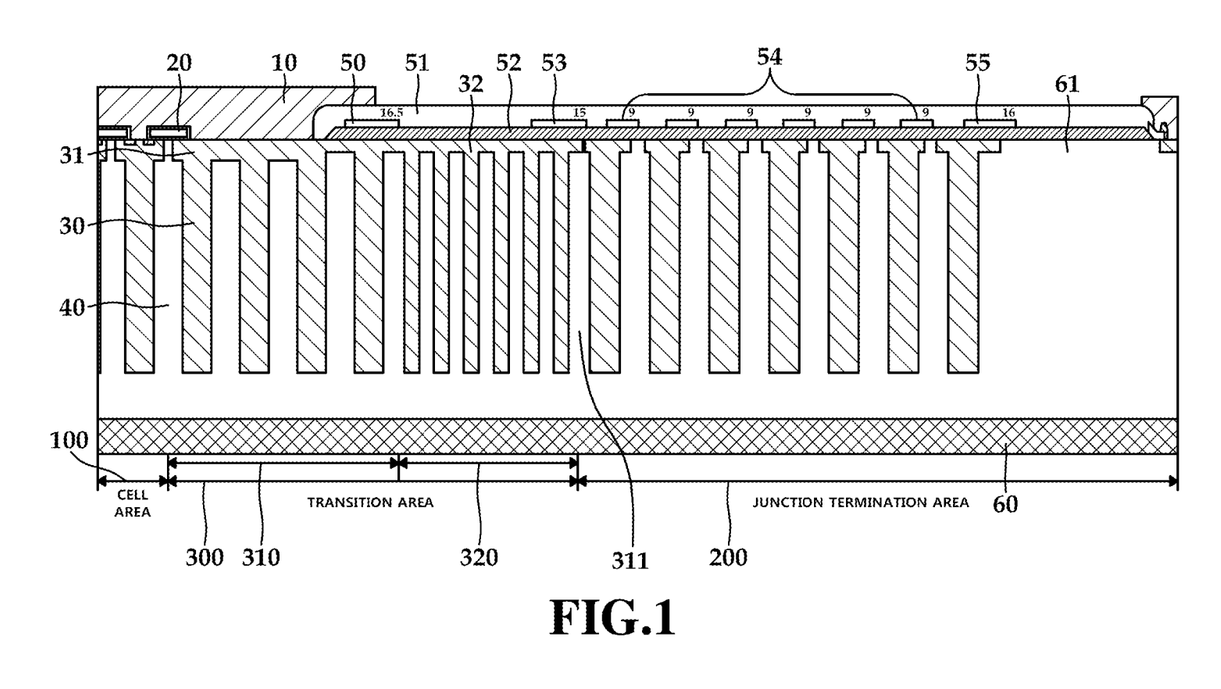
FIG. 1 illustrates a cross-sectional view of an example of a super junction semiconductor device.
Figure 2:
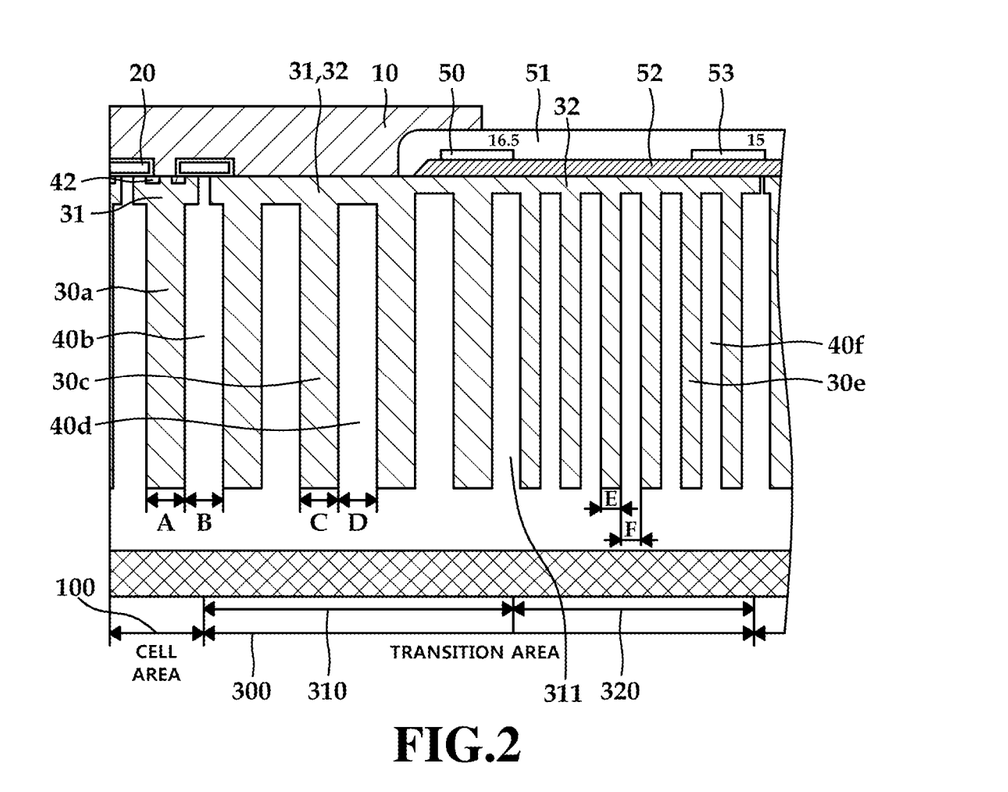
FIG. 2 illustrates an enlarged cross-sectional view of a transition area of the super junction semiconductor device illustrated in FIG. 1.
Figure 3:
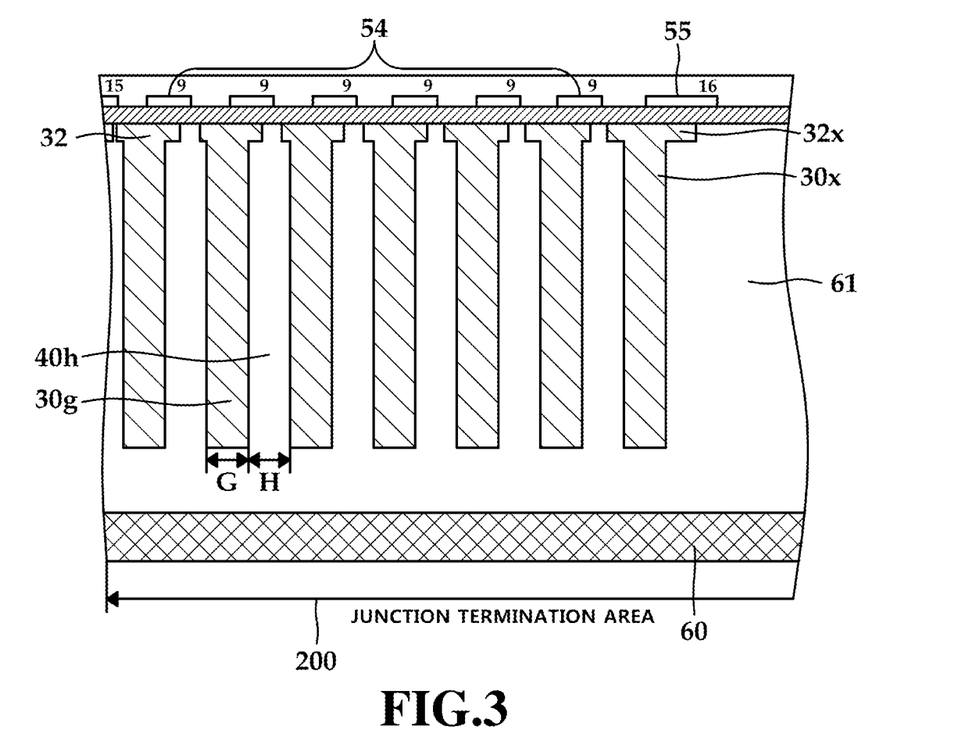
FIG. 3 illustrates an enlarged cross-sectional view of a junction termination area of the super junction semiconductor device illustrated in FIG. 1.

FIGS. 1 to 3 are cross-sectional views illustrating an example of a super junction semiconductor device according to the present disclosure. The illustrated super junction semiconductor device is a vertical structure super junction semiconductor device, and a power MOSFET.

Referring to the drawings, the super junction semiconductor device includes a cell area 100, a junction termination area 200, and a transition area 300.

The cell area 100 includes a plurality of N-type pillar regions 40 and a plurality of P-type pillar regions 30 that are formed on an N-type substrate 60. Although FIG. 1 illustrates only a small portion of the cell area in order to show the junction terminal area 200 and the transition area 300 in detail, the actual area of the cell area is larger than those of the junction termination area 200 and the transition area 300 in an actual device.

The N-type pillar regions 40 and the P-type pillar regions 30 are alternately formed, and are arranged in a direction parallel to a surface of the substrate 60. After an N-type epitaxial layer 61 is formed, the P-type pillar regions 30 are formed by performing ion implantation by using a P-type dopant. The P-type pillar regions 30 are finally formed through dopant diffusion by heat treatment. Regions in which the P-type ion implantation is not performed become the N-type pillar regions 40. Accordingly, the N-type pillar regions 40 are parts of the N-type epitaxial layer 61.

The P-type pillar regions 30 are formed so as not to penetrate the N-type substrate 60, and are formed only within the N-type epitaxial layer 61. When the P-type pillar regions are formed to penetrate the N-type substrate 60, because the N-type substrate 60 is a high-concentration N-type region, a depletion layer is not increased; rather, an electric field is increased to decrease a breakdown voltage.

The junction termination area 200 is formed to surround the cell area 100, and the transition area 300 is formed between the cell area 100 and the junction termination area 200. Accordingly, when the electric field extends to the junction termination area 200, the transition area 300 formed between the cell area and the junction termination area serves as a buffer to additionally form a voltage drop area, so that it is possible to reduce a burden on a voltage in the junction termination area 200. In this example, the transition area 300 is designed so as to allow voltage to sufficiently drop before reaching the junction termination area 200.

For this reason, the voltage drop is first caused at the depletion layer extended to the transition area 300, and the other voltage can be actually maintained at the junction termination area 200.

With this design, the topmost portions of the pillar regions in the transition area 300 are connected at the same potential to cause sufficient voltage drop. In contrast, the junction termination area 200 is in a floating state where upper portions of the pillar regions 30 and 40 are not connected.

That is, according to the example, the transition area 300 is disposed, and upper ends of the P-type pillar regions 30 are connected to each other at the same potential in the transition area 300, so that the depletion layers between the P-type pillar regions 30 and the N-type pillar regions 40 are completely extended to cause the sufficient voltage drop.

Figure 6:
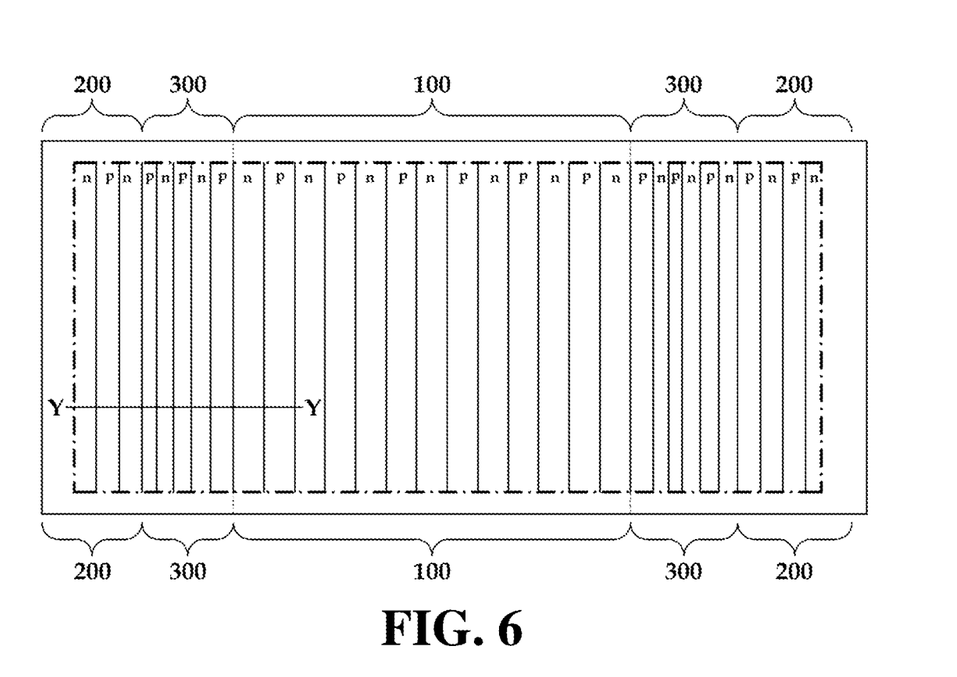
FIG. 6 illustrates a plan view of an example of a super junction semiconductor device.

FIG. 6 illustrates a plan view of the super junction semiconductor device illustrated in FIG. 1. As illustrated in FIG. 6, the cell area 100 is surrounded by the junction termination areas 200, and the transition areas 300 are disposed between the cell area 100 and the junction termination areas 200. FIG. 1 reflects a cross-sectional view of the superjunction semiconductor device taken along line Y-Y of FIG. 6

FIG. 2 is an enlarged view of FIG. 1. Referring to FIG. 2, the transition area 300 may be divided into two regions. For example, the transition area may be divided into a first area 310 that is disposed close to the cell area 100 and a second area 320 that is disposed close to the junction termination area 200. Referring to FIG. 2, the first area 310 and the second area 320 have different column (or pillar) sizes. Although both the N-type and P-type pillar regions 30 and 40 are formed in the first area 310 and the second area 320, the widths of the N-type and P-type pillar regions in the first area 310 are different from the widths of the N-type and P-type pillar regions in the second area 320.

Referring to FIG. 2, the widths of the P-type pillar regions 30a, 30c and 30e and the N-type pillar regions 40b, 40d and 40f are represented as A, C, E, B, D and F. The A and B represent a width of the P-type pillar (column) region 30a and an average width of the N-type pillar (column) region 40b in the cell area, respectively. The C and D represent a width of the P-type pillar (column) region 30c and an average width of the N-type pillar (column) region 40d in the first area 310, respectively. The E and F represent a width of the P-type pillar (column) region 30e and an average width of the N-type pillar (column) region 40f in the second area 320, respectively.

Widths of the N-type and P-type pillar regions are uniform in the event that the N-type and P-type pillar regions are formed as trench type columns, whereas widths of the N-type and P-type pillar regions are not completely uniform when the N-type and P-type pillar regions are formed as stack type columns formed by repetitively implanting P-type ions to the epitaxial layer 61 while the epitaxial layer 61 is grown in several steps. For instance, if the P-type columns are formed by doping a region of the epitaxial layer 61 each time additional layer of the epitaxial layer 61 is grown, the P-type column is likely to have non-uniform widths. For this reason, the average width is used.

In the first area 310 of the transition area 300, an average width (C+D) of a unit cell of the P-type pillar region 30c and the N-type pillar region 40d is approximate to or equal to an average width (A+B) of a unit cell of the P-type pillar region 30a and the N-type pillar region 40b of the cell area 100.

In contrast, an average width (E+F) of the P-type pillar region 30e and the N-type pillar region 40f of the second area 320 is smaller than a width (A+B) of the P-type and N-type pillar regions 30a and 40b in the cell area 100 or a width (C+D) of the P-type and N-type pillar regions 30c and 40d in the first area 310. In other words, the pillar regions of the second area 320 are formed to have widths smaller than the average width (A+B) of the pillar regions of the cell area 100.

However, a ratio (A/B) of the width of the P-type pillar region 30 to the width of the N-type pillar region 40 is substantially approximate or equal in all areas. That is, when the ratio (A/B) of the width of the P-type pillar region 30a to the width of the N-type pillar region 40b is 1, a ratio C/D or a ratio E/F in the transition area 300 is 1. This is because specific resistance of the epitaxial layer 61 is not allowed to be horizontally different. That is, by designing the pillar regions to have the same ratios, the quantities of N-type and P-type charges are balanced in all areas, so that it is possible to form the depletion layers having the same length. If the ratios are different from each other, the quantities of charges are not balanced in some areas. For this reason, a maximum electric field locally reaches a critical electric field in some area, so that an undesired breakdown voltage may occur at a lower voltage.

Further, in the cell area, N-type source regions 42 are formed within a P-type body region 31 while coming in contact with the P-type body region 31. However, in the transition area 300, only the P-type body region 31 is formed, and the N-type source region is not formed. A source electrode 10 is disposed on the first area 310 and is electrically connected to the P-type pillar regions 30a and 30c. The same source electrode 10 is used in the cell area 100 and the transition area 300.

In a turned-off state, in order to extend the depletion region and to alleviate the electric field, a P-type extension region (also referred to as a pillar bridge ring (PBR) region) is formed at the upper portions of the P-type pillar regions 30 near a surface of the N-type epitaxial layer by using a boron (B) dopant. A PBR region 32 is formed only at the transition area 300 and the junction termination area 200 except for the cell area 100. The P-type pillar extension region (the PBR region) has a doping concentration substantially approximate to that of the P-type pillar region 30.

After a field oxidation film such as LOCOS or STI is formed, the P-type body region 31 is formed at the upper portions of the P-type pillar regions by performing ion implantation for adjusting Vth onto the surface of the N-type epitaxial layer 61 in the first area 310 of the transition area 300, similarly to the cell area 100. In this example, the P-type body region 31 is formed with a higher dose at a depth deeper than that of the PBR region 32 due to high ion implantation energy. A dose of $10^{13}/cm^2$ or more is implanted to the P-type body region 31, and a dose of less than $10^{13}/cm^2$ is implanted to the PER region. Accordingly, since the P-type body region 31 and the PER region 32 are formed to overlap at the upper portions of the P-type pillar regions in the first area 310, the P-type doping concentration in the first area is locally very higher than that in the cell area 100, the second area 320 or the junction termination area 200.

This is because Vth ion implantation is prevented and the P-type body is not formed due to a field oxidation film 52 formed in the second area 320 or the junction termination area 200. Instead, as the ion implantation for forming the PER region 32 is performed after the P-type pillar regions are formed and before the field oxidation film is formed, the PER region 32 is formed in the second area 320.

Referring to FIG. 2, the N-type pillar region 40f in the second area 320 is formed closer to the surface of the N-type epitaxial layer 61 than that in the first area 310. This is because the P-type body region 31 is not formed and only the PER region 32 formed at ion implantation energy lower than that of the P-type body region 31 exists in the second area.

Furthermore, because the PBR region 32 exists near the surface of the N-type epitaxial layer 61 in the second area 320, an area of the N-type pillar region 40 is relatively small. Accordingly, complete depletion is easily achieved near the surface of the N-type epitaxial layer 61. For this reason, a maximum electric field is also decreased, so that maximum voltage drop occurs. The PBR region 32 is further described with reference to FIG. 5.

In a device in which a size of the source electrode 10 disposed on the first area 310 is decreased to further extend the field oxidation film 52 toward the cell area 100, the maximum electric field is further decreased. Thus, a margin of a critical electric field with respect to the breakdown voltage is further increased. As a result, it is possible to obtain a more stable breakdown voltage.

The first area 310 of the transition area 300 is disposed closer to the cell area 100 than the second area 320 and has the same structure as that of the cell area 100. However, the N+ source region does not exist in the first area. Accordingly, the source electrode 10 comes in direct contact with the surfaces of the P-type pillar regions 30 through the P-type body region 31 and the PBR region 32, and the source electrode is electrically connected to the P-type pillar regions. Therefore, even when current is generated by an avalanche breakdown phenomenon occurring in a drain region at a lower end of the junction termination area 200, the current can be allowed to quickly pass through the source electrode 10.

In other words, since a source contact does not exist immediately above the junction termination area, the current flowing in the drain region at the lower end of the junction termination area 200 needs a path through which reverse current flows. The closest path is the first area 310 that is closest to the junction termination area 200 and in which the source electrode 10 is disposed. When the current is concentrated on the region, the regions may be easily damaged due to current density higher than that of the cell area 100.

When the N+ source region exists in this area as in the cell area 100, diodes of the N+ source region and the P-type body region are turned on in a forward direction on the path through which the current flows, and a subsidiary bipolar junction transistor (BJT) may also be turned on. To prevent this, the source region 42 exists in the cell area. However, it is required to design that current is allowed to flow toward the source electrode without damaging a product when avalanche current flows by removing the N+ source region of the transition area 300.

Moreover, similarly to the cell area 100, the first area of the transition area 300 is formed to have the depletion layers to the max at the same quantities (ion dose amounts) of N-type charges and P-type charges. That is, the N-type and P-type pillar regions may be formed to have the same quantity of charges. It is possible to distribute the concentration of current for the reverse current flown by a reverse voltage by allowing the maximum electric field to be the same as that of the cell area 100 by balancing the quantity of charges. Although the ion implantation to the P-type pillar regions 30 is performed at a smaller area, ions are diffused by heat treatment, and the P-type pillar regions 30 have areas and widths substantially approximate to those of the N-type pillar regions (the N-type epitaxial layer) 40, as illustrated in FIG. 1 or 2.

In addition, the cells of the second area 320 of the transition area 300 have maximum electric field values lower than those of the cells of the first area 310. To achieve the low maximum electric field values, a length of the N-type pillar region 40f and a length of the P-type pillar region 30e in a horizontal direction of the transition area 300 are set to be smaller a length of the N-type pillar region 40 and a length of the P-type pillar region 30 of the cell area 100.

The depletion layers extend at the same length by an applied voltage. However, because a length between the N-type pillar region 40f and the P-type pillar region 30e is short, non-depletion layers are reduced in the cells of the second area 320 of the transition area 300. As the length between the N-type pillar region and the P-type pillar region is decreased, the depletion layers are formed at a low voltage. Accordingly, the maximum electric field is low.

The small unit cell has an advantage in that the depletion layers extend to the P-type pillar regions 30e or the N-type pillar regions 40f more quickly. This is due to the fact that the quantity of implanted charges is relatively small and that the small unit cell has a smaller concentration.

In order to secure a high breakdown voltage, a size of the second area 320 in the horizontal direction needs to be gradually decreased. However, the following problems may be caused in a device in which the size of the unit cell, including a N-type and a P-type pillar, existing in the second area 320 is decreased to obtain the high breakdown voltage. At the time of forming the P-type pillar regions 30e, upper and lower portions of the P-type pillar regions 30e constituting the P-type pillar regions 30e may be separated from each other without being connected to each other. The P-type dopant is implanted to form the P-type pillar regions 30e. In this example, in order to reduce the width of the P-type pillar region, the amount of diffused P-type dopants needs to be reduced. However, to reduce the amount of the diffused dopants, the amount of dopants that is diffused upward and downward is reduced. Thus, the distances between the P-type pillar regions in an up and down direction are increased.

In other word, the radius of curvature having an ellipse shape formed by diffusing the P-type pillar regions 30e is decreased, and the upper and lower ends of the pillar regions 30e may not be connected to each other. For this reason, the P-type pillar regions 30e may be separated from each other. As a result, an electric field may be decreased toward the lower end of the P-type pillar in the vertical direction, and the electric field may be increased at the upper end thereof. In such an event, although it may be possible to obtain a breakdown voltage higher than that of a planar MOSFET device, it is difficult to manufacture a super junction MESFET device.

Referring to FIG. 2, it can be seen that the source electrode 10 is formed on an oxidation film 51 made from borophosphosilicate glass (BPSG) to further extend toward the junction termination area 200. The source electrode extends in close vicinity to a boundary 311 between the first area 310 and the second area 320, but does not extend up to the first P-type pillar region 30e belonging to the second area 320. Thus, potential of the source electrode 10 serves to extend toward the junction termination area 200. This is because the source electrode 10 is connected to the PER region 32 and the P-type body region 31 of the P-type pillar region 30 in the transition area 300. Accordingly, the maximum electric field is decreased. Therefore, the source electrode 10 may serve as a metal plate.

In addition, referring to FIG. 1, a plurality of poly plates 50, 53, 54, and 55 are formed on the field oxide film 52. In this example, the poly plates 50, 53, 54 and 55 have a width of approximately 16.5, 15, 9 and 16 µm. Thus, the width of poly plates 54 are smaller than the width of poly plates 50, 53 and 55 disposed in the transition area 300 and at the outer periphery of junction area. The width of poly plate depends on the width of P-type pillar region 30 overlapped with the poly plate. For example, the first poly plate 50 has larger width than the second poly plate 53, because the width of P-type pillar region 30 under the first poly plate 50 is wider than that under the second poly plate 53. Referring to FIG. 2, a starting point of the first poly plate 50 overlaps with the metal plate (source electrode) 10 and an ending point thereof extends toward the junction termination area 200 from an edge portion of the metal plate (source electrode) 10. The first poly plate 50 serves to further reduce a magnitude of the electric field starting at the edge portion of the source electrode 10. Accordingly, the electric field transferred to the junction termination area 200 is decreased and the maximum electric field is reduced.

The second poly plate 53 is disposed at an ending point of the transition area 300 toward the interface between the junction terminal area 200 and the transition area 300, and there is no poly plate between the first poly plate 50 and the second poly plate 53. The second poly plate 53 is used to easily apply the electric field toward the junction termination area. Since P-type pillar regions 30g in the junction termination area 200 are all in a float state, the second poly plate is necessary.

Figure 5:
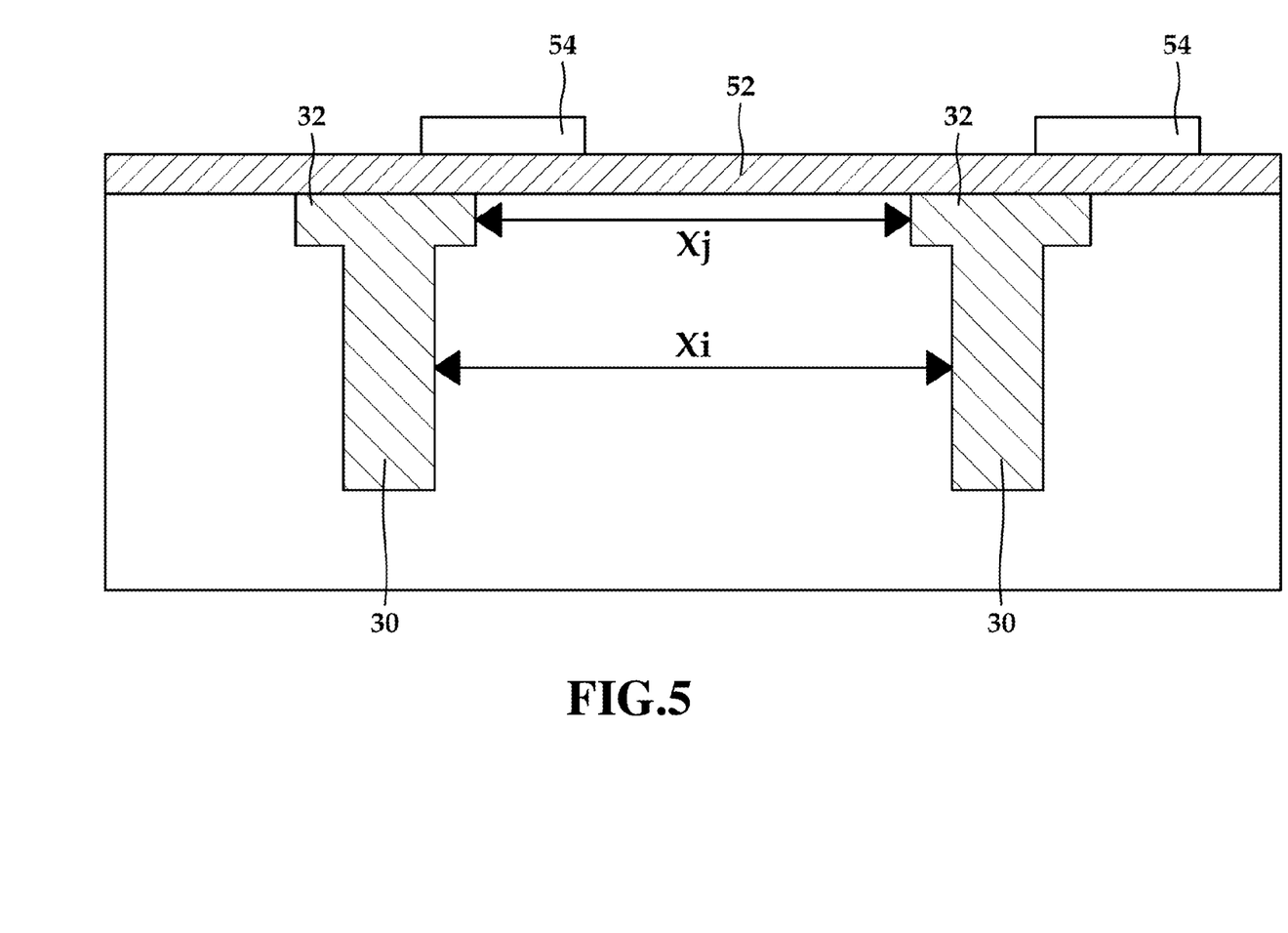
FIG. 5 illustrates an enlarged cross-sectional view of the super junction semiconductor device illustrated in FIG. 4.

Furthermore, referring to FIG. 3, a plurality of poly plates 54 and 55 exist in the junction termination area 200 (see FIG. 3). That is, there are the poly plates 54 and 55 in one-to-one correspondence with the P-type pillar regions 30g. Moreover, as described further below with reference to FIG. 5, each of the poly plates 54 extends toward the right at a greater degree than the P-type ring 30g. Referring to FIG. 5, the poly plates 54 protrudes toward the periphery of the junction terminal area by a predetermined length. However, each of the poly plates 54 does not extend as to reach the next P-type pillar region. The predetermined length of protrusion is less than the width Xj between two adjacent PBR regions 32.

FIG. 3 is an enlarged view of the junction termination area. The unit cell size (G+H) of the junction termination area 200 is equal to or smaller than the unit cell size (A+B) of at least the cell area 100. Here, the unit cell means a combination of one N-type pillar region 40h and one P-type pillar region 30g corresponding to the N-type pillar region. The P-type pillar regions 30g in the junction termination area are independent without being connected to each other. The P-type pillar regions in the junction termination area are in a floating state. The reason that the P-type pillar regions are in the floating state is due to the fact that all the electric fields are not concentrated on the last pillar region 30x. If the pillar regions in the junction termination area 200 are connected to each other at the same potential as in the transition area 300, since the pillar regions are electrically connected to each other, all the electric fields are applied to the last ring 30x of the junction termination area 200. For this reason, the device is damaged.

Similarly to the second area 320, the PBR region 32 is formed in the junction termination area 200. Further, a plurality of poly plates 54 and 55 are formed in the junction termination area. The plurality of intermediate poly plates 54 are similar in size or have the same size, whereas the last poly plate 55 has a length slightly longer than that of the previous poly plate 54. This is because the PBR region 32x connected to the last P-type pillar region 30x corresponding to the poly plate 55 protrudes toward the right to be slightly long. The last poly plate 55 is extended to have a longer width in comparison to other poly plates 54 in order to reduce the electric field by some degree.

Figure 4:
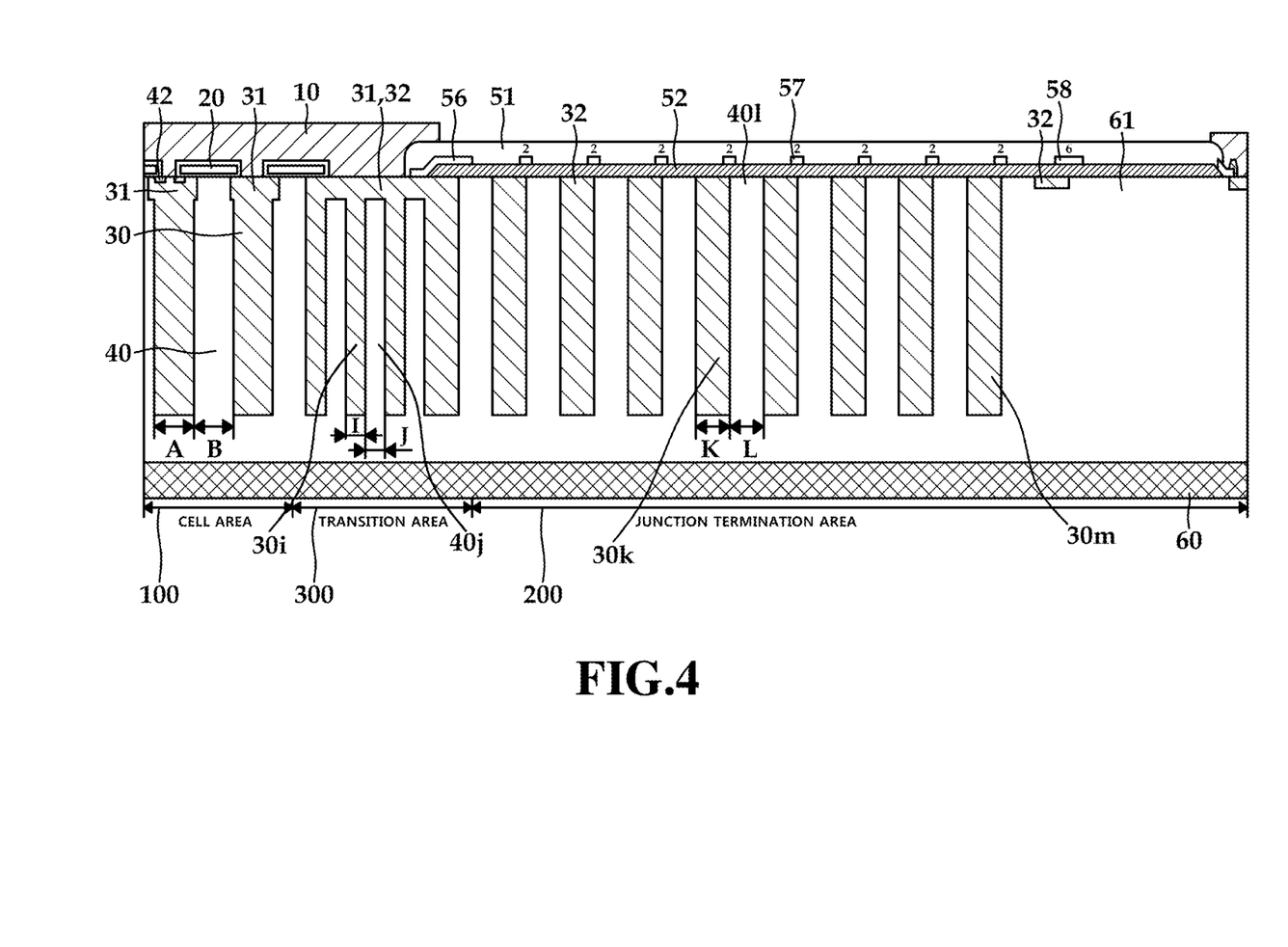
FIG. 4 illustrates a cross-sectional view of another example of a super junction semiconductor device according to the present disclosure.

FIG. 4 is a cross-sectional view illustrating an example of a super junction semiconductor device. The illustrated super junction semiconductor device is a vertical structure super junction semiconductor device.

The super junction semiconductor device is integrally formed without being divided into two areas, and a unit cell size inside the junction termination area 200 is smaller than a unit cell size inside the cell area 100.

The transition area 300 does not include the first area 310 described with respect to the example illustrated in FIG. 1; rather, the transition area 300 illustrated in FIG. 4 includes only the second area 320. By forming the transition area 300 with only the second area 320, it is possible to reduce a size of a chip. In this example, an average width (I+J) of a unit cell of pillar regions 30i and 40j of the transition area 300 is smaller than a width (A+B) of a unit cell of the cell area 100. Although the width is small, a ratio (I/J) of a width of the N-type pillar region 40j to a width of the P-type pillar region 30i is approximate to a width ratio (A/B) of the cell area 100. Furthermore, due to the small cell size, since the depletion layer is easily formed in a horizontal direction, it is possible to obtain a high breakdown voltage.

In the junction termination area 200, a unit cell size (K+L) is smaller than a unit cell size (A+B) of the cell area 100 and is greater than a width (I+J) of the transition area 300. Accordingly, the maximum electric field is further decreased in comparison to that of the cell area 100.

By using the field oxide film 52 on the junction termination area 200, it is possible to prevent boron and phosphorous atoms from being diffused to the epitaxial layer 61 by a BPSG oxidation film 51. A plurality of N-type poly plates 56, 57, and 58 are formed on the field oxide film 52. The first poly plate 56 is formed on the transition area 320 and is connected to the P-type pillar region 30i. This is because the electric field is easily applied toward the junction termination area 200.

In addition, the plurality of intermediate N-type poly plates 57 are formed to be distributed in the junction termination area 200. However, the plurality of intermediate N-type poly plates 57 are in a floating state by being connected to the P-type pillar regions 30. In order to extend the depletion layer to neighboring ring (P pillar region), the poly plate 50 is formed such that an end of the poly plate further extends than an end of the pillar region 30 while the poly plate is overlapped with the pillar region 30 (see FIG. 5).

In addition, the last poly plate 58 has a size greater than that of the intermediate poly plates 57 in the junction terminal area 200. Further, only the P-type pillar extension region (or PBR region) 32 is formed at the location for a P-type pillar region 30 that corresponds to the last poly plate 58. Accordingly, the P-type pillar extension region has a depth remarkably smaller the depths of other P-type pillar regions 30k and 30m in the junction termination area 200. The reason that only the P-type pillar extension region 32 is formed at the end of the junction termination area 200 is to extend the electric field. Accordingly, it is possible to finally increase the breakdown voltage. If the P-type pillar extension region does not exist, since an electric field having the same potential as that of the P-type pillar region 30m comes in direct contact with the N-type epitaxial layer 61, the electric field is sharply bent. To prevent this, the P-type pillar extension region (PBR region) 32 is formed to extend the electric field in order for the electric field to be prevented from sharply bending.

Furthermore, referring to FIG. 5, after the ion implantation to the PBR region (or P-type pillar extension region 32 is performed, a width Xj of the upper end of the N-type pillar region existing below the field oxide film is narrower than a width Xi of the N-type pillar region 40 in the horizontal direction existing between the P-type pillar regions 30 by the diffusion of the P-type ion implantation by heat treatment after ion implantation. Alternatively, an N doping concentration of the upper end Xj may be smaller than an N doping concentration of the lower end (Xi).

When the width of the upper end Xj is wide or the N-type dopant concentration is high, since the depletion layer does not extend, the electric field at the ring is further increased to easily reach the critical electric field. For this reason, it is possible for a large amount of leakage current to be generated. Accordingly, in order to prevent this, the PBR ion implantation is additionally performed on the upper portions of the P-type pillar regions 30 to form the PBR region 32.

However, when the N-type dopant concentration is excessively decreased by the ion implantation of the PBR region 32, the electric field is easily applied to the next ring but may be excessively applied to the last ring, damaging the device. Accordingly, the N-type dopant concentration and the width near a surface of the field oxide film need to be set appropriately. The ion implantation of the PBR region 32 may be set to an appropriate width and dopant concentration to prevent the damage. In various examples of the present disclosure, the PER ion implantation may be performed at 1E 13/cm$^2$ or less by using a dopant including boron (B).

In addition, the poly plates 54 are disposed in one-to-one correspondence with the P-type pillar regions 30. Each of the poly plates is formed so as to extend further to the right than the P-type ring 30. However, the poly plate is not extended up to the next P-type ring 30, but is spaced apart from the next P-type ring 30.

Figure 7:
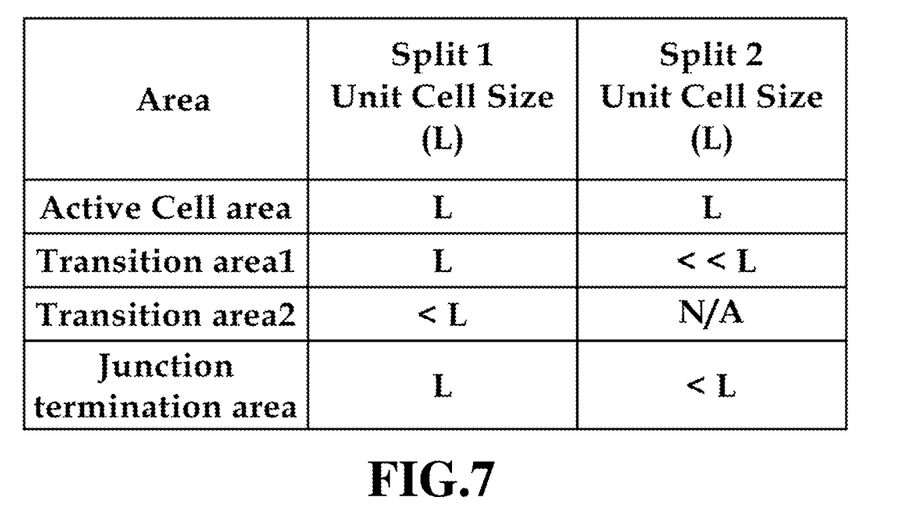
FIG. 7 is a table summarizing relative dimensions used in two different examples of super junction semiconductor devices according to the present disclosure.

In conclusion, the unit cell sizes are represented in a table illustrated in FIG. 7. When a size of a unit cell corresponding to a sum of a width of a N-type pillar region and a width of an adjacent P-type pillar region of the cell area 100 is L, the unit cell sizes of the transition area 300 and the junction termination area 200 are represented as being greater than, equal to, or less than L.

Firstly, in the example of a semiconductor device having a Split 1 structure (Split 1) as illustrated in FIG. 1, the unit cell of the first transition area 310 is approximate to or equal to the unit cell size of the cell area 100, whereas the unit cell size of the second transition area 320 is smaller than the unit cell size of the cell area 100. For instance, the sum of the horizontal widths of a P-type pillar region and its adjacent N-type pillar region in the second transition area 320 is smaller than the sum of the horizontal widths of a P-type pillar region and its adjacent N-type pillar region in the cell area 100.

Moreover, the unit cell size of the junction termination area 200 is equal to or smaller than the unit cell size of at least the cell area 100. In this description, the unit cell refers to a combination of one N-type pillar region 40 and one adjacent P-type pillar region 30 that corresponds to the N-type pillar region.

Further, in the semiconductor device having a Split 2 structure (Split 2) as illustrated in FIG. 4, the unit cell size of the transition area 300 is smaller than the unit cell size of the cell area 100 or the unit cell size of the junction termination area 200. Furthermore, the unit cell size of the junction termination area 200 is smaller than the unit cell size of the cell area 100.

In the transition area 300 and the junction termination area 200, the cells have sizes smaller than the unit cell size of the cell area 100, and the maximum electric field value in the transition area 300 or the junction termination area 200 is lower than the maximum electric field value of the cell area 100.

By doing this, it is possible to generate the breakdown voltage of the device only in the cell area 100. This is because areas of the transition area 300 and the junction termination area 200 are smaller than an area of the cell area 100.

Accordingly, it is possible to obtain more stable reliability and to uniformly distribute the concentration of the reverse current in the cell area 100 having a larger area. As a result, it is possible to obtain an excellent super junction semiconductor device.

A ratio of a length of the N-type pillar region 40 to a length of the P-type pillar region 30 in the horizontal direction of the transition area 300 is the same as a ratio in the cell area 100.

Since specific resistance of the N-type pillar regions 40 is not allowed to be horizontally different and ions are simultaneously implanted to the P-type pillar regions 30 in the horizontal direction, by allowing the N-type pillar region and the P-type pillar region to have the same length ratio, even though the electric field on the surface of the P-type pillar region 30 or the N-type pillar region 40 is decreased, the depletion layers have the same length in the all areas.

In a device in which the electric field is decreased at the upper portion of the epitaxial layer 61, the N-type and P-type charges need to be equally depleted. If the length ratio is different from each other, the N-type and P-type charges are depleted to each other, so that the N-type and P-type charges are not balanced. As a result, characteristics of the product are degraded.

That is, when the length ratio is different from each other, since the quantity of charges is not balanced at a portion where the ratio is different, the depletion layer is maximized or minimized at one local region of the P-type pillar region 30 or the N-type pillar region 40, so that the local maximum electric field reaches the critical electric field due to the region where the depletion layer is maximized or minimized quicker than other portions. As a result, an undesired breakdown voltage is obtained. This phenomenon may occur in the original cell or may occur in another cell where the ratio is different.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A super junction semiconductor device comprising:
a cell area and a junction termination area disposed on a substrate; and
a transition area disposed between the cell area and the junction termination area,
wherein the cell area, the junction termination area, and the transition area each include at least one unit cell, the unit cell comprising a N-type pillar region and adjacent to a P-type pillar region,
wherein the unit cells are disposed adjacent to each other such that the corresponding N-type pillar regions and the P-type pillar regions alternate through the cell area, the junction termination area and the transition area, and
wherein an average width of a unit cell in the transition area is smaller than an average width of a unit cell in the cell area and the junction termination area.

2. The super junction semiconductor device according to claim 1, wherein upper ends of the P-type pillar regions in the transition are and the cell area are electrically connected to be at substantially the same potential.

3. The super junction semiconductor device according to claim 1, wherein the junction termination area is in a floating state.

4. The super junction semiconductor device according to claim 1, wherein an average width of the unit cell of the junction termination area in a horizontal direction is equal to or smaller than an average width of the unit cell of at least the cell area.

5. The super junction semiconductor device according to claim 1, wherein ratios between widths of the N-type pillar regions and widths of the P-type pillar regions within the unit cell are substantially the same.

6. The super junction semiconductor device according to claim 1, wherein the transition area and the junction termination area further include a P-type pillar extension region.

7. The super junction semiconductor device according to claim 6, wherein only the P-type pillar extension region is formed at an end of the junction termination area without forming the P-type pillar region.

8. The super junction semiconductor device according to claim 1, further comprising a field oxide film and a plurality of poly plates disposed on the substrate.

9. The super junction semiconductor device according to claim 8, further comprising:
a source metal electrode connected to the transition area;
wherein the source metal electrode extends toward the junction termination area so as not to completely overlap with a first poly plate among the plurality of poly plates,
wherein the first poly plate is wider than other of the plurality of the poly plates.

10. The super junction semiconductor device according to claim 9, wherein a second ploy plate disposed adjacent to the first poly plate has a smaller width than the first poly plate, and wherein the first poly plate and the second poly plate are in a floating state.

11. The super junction semiconductor device according to claim 8, wherein the P-type pillar regions and the poly plates are formed in one-to-one correspondence with each other in the junction termination area.

12. The super junction semiconductor device according to claim 1, further comprising:
a source metal electrode connected to the transition area; and
a first poly plate partially overlapping with the source metal electrode,
when a starting point of the first poly plate overlaps with the source metal electrode and an ending point of the first poly plate extends towards the junction termination area from an edge portion of the source metal electrode, and
wherein the first poly plate and the source metal electrode are not electrically connected.

13. The super junction semiconductor device according to claim 1, wherein a width of the N-type pillar region at an upper end of the junction termination area is smaller than a width at a lower end thereof.

14. The super junction semiconductor device according to claim 1, wherein the transition area comprises a first area and a second area.

15. The super junction semiconductor device according to claim 14, wherein an average width of a unit cell area of the first area in a horizontal direction is greater than an average width of a unit cell area of the second area.

16. The super junction semiconductor device according to claim 1, further comprising:
a P-type body region in the cell area; and
a source region within the P-type body region.

17. The super junction semiconductor device according to claim 16, wherein the source region is not included in the transition area.

18. The super junction semiconductor device according to claim 1, wherein an average width of a unit cell in the junction termination area is smaller than an average width of a unit cell in the cell area.

19. A super junction semiconductor device comprising:
an epitaxial layer of first conductivity type comprising a cell area, a junction termination area surrounding the cell area, and a transition area disposed between the cell area and the junction termination area;
second conductivity type pillar regions alternatively disposed between first conductivity type pillar regions of the epitaxial layer such that the cell area, the junction termination area and the transition area each include two or more pairs, each pair comprising a second conductivity type pillar region and a first conductivity type pillar region;
wherein an average horizontal width of a pair of first conductivity type pillar region and second conductivity type pillar region in the cell area and the junction termination area is greater than that in the transition area.

20. The super junction semiconductor device according to claim 19, further comprising:
a body region of second conductivity type disposed on each of second conductivity type pillar regions within the cell area;
a pillar extension region disposed on each of second conductivity type pillar regions within the transition area and the junction termination area; and
a plurality of poly plates each disposed above the pillar extension region in the junction termination area.

21. The super junction semiconductor device according to claim 20, wherein an outermost pillar extension region in the junction termination area is paired with a poly plate having a greater horizontal width than widths of other poly plates in the junction termination area.

22. The super junction semiconductor device according to claim 20, further comprising:
- a source metal electrode connected to the transition area; and
- a first poly plate partially overlapping with the source metal electrode,
- wherein a starting point of the first poly plate overlaps with the source metal electrode and an ending point of the first poly plate extends towards the junction termination area from an edge portion of the source metal electrode, and
- wherein the first poly plate and the source metal electrode are not electrically connected.

23. The super junction semiconductor device according to claim 20, further comprising:
- a source metal electrode connected to the transition area; and
- a plurality of poly plates disposed on the epitaxial layer,
- wherein the source metal electrode extends toward the junction termination area so as to partially overlap with a first poly plate among the plurality of poly plates, and
- wherein the first poly plate is wider than other of the plurality of poly plates.

24. The super junction semiconductor device according to claim 20, wherein the combined average horizontal width of the first conductivity type pillar region and second conductivity type pillar region in the junction termination area is smaller than that in the cell area.

* * * * *